United States Patent
Hein et al.

(10) Patent No.: US 7,587,571 B2
(45) Date of Patent: Sep. 8, 2009

(54) EVALUATION UNIT IN AN INTEGRATED CIRCUIT

(75) Inventors: Thomas Hein, Munich (DE); Aaron John Nygren, San Francisco, CA (US); Rex Kho, Holzkirchen (DE)

(73) Assignee: Qimonda AG, Munich (DE)

( * ) Notice: Subject to any disclaimer, the term of this patent is extended or adjusted under 35 U.S.C. 154(b) by 405 days.

(21) Appl. No.: 11/564,764

(22) Filed: Nov. 29, 2006

(65) Prior Publication Data

US 2008/0123438 A1    May 29, 2008

(51) Int. Cl.
G06F 12/00 (2006.01)
G06F 13/00 (2006.01)
G06F 13/42 (2006.01)

(52) U.S. Cl. .............. 711/170; 711/154; 711/211; 711/212; 710/300; 710/106; 710/307; 710/316

(58) Field of Classification Search .......... 711/149, 711/154, 211, 212; 710/100, 300, 104, 106, 710/305, 307, 316
See application file for complete search history.

(56) References Cited

U.S. PATENT DOCUMENTS

| | | | | |
|---|---|---|---|---|
| 6,359,815 | B1 * | 3/2002 | Sato et al. | 365/198 |
| 6,510,503 | B2 * | 1/2003 | Gillingham et al. | 711/167 |
| 6,889,304 | B2 | 5/2005 | Perego et al. | |
| 7,484,064 | B2 * | 1/2009 | Ware et al. | 711/167 |
| 2004/0054845 | A1 * | 3/2004 | Ware et al. | 711/100 |
| 2004/0098545 | A1 * | 5/2004 | Pline et al. | 711/154 |

* cited by examiner

*Primary Examiner*—Jack A Lane
(74) *Attorney, Agent, or Firm*—Patterson & Sheridan, L.L.P.

(57) ABSTRACT

An integrated circuit comprising a first terminal for exchanging signals; an evaluation unit coupled to the first terminal, the evaluation unit evaluating a signal level applied to the first terminal to determine whether or not the signal level corresponds to a predetermined signal level; and a switching unit coupled to the first terminal and to the evaluation unit, the switching unit admitting signal exchange via the first terminal if the evaluation unit does not determine the predetermined signal level, the switching unit cutting off signal exchange via the first terminal if the evaluation unit determines the predetermined signal level.

7 Claims, 7 Drawing Sheets

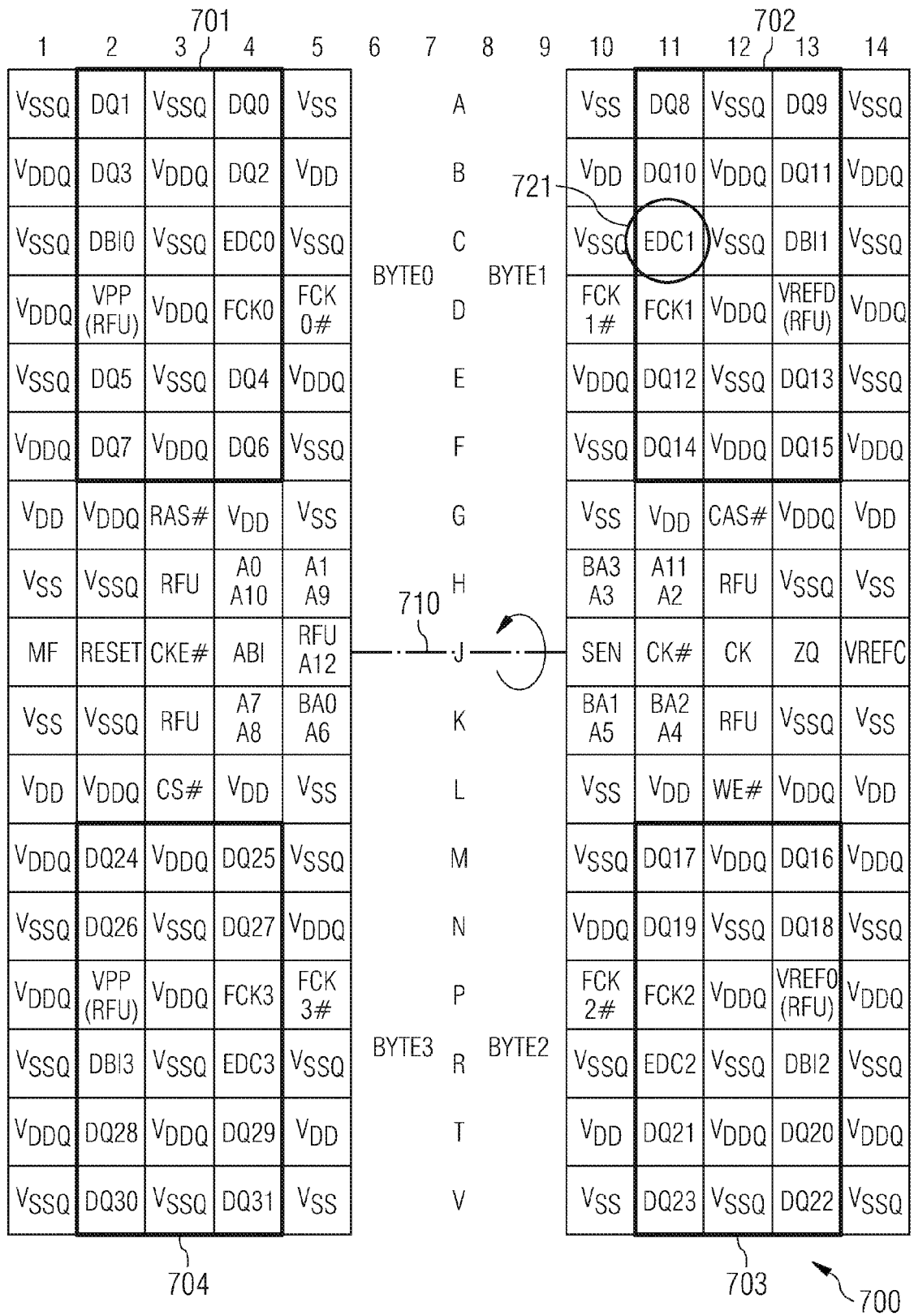

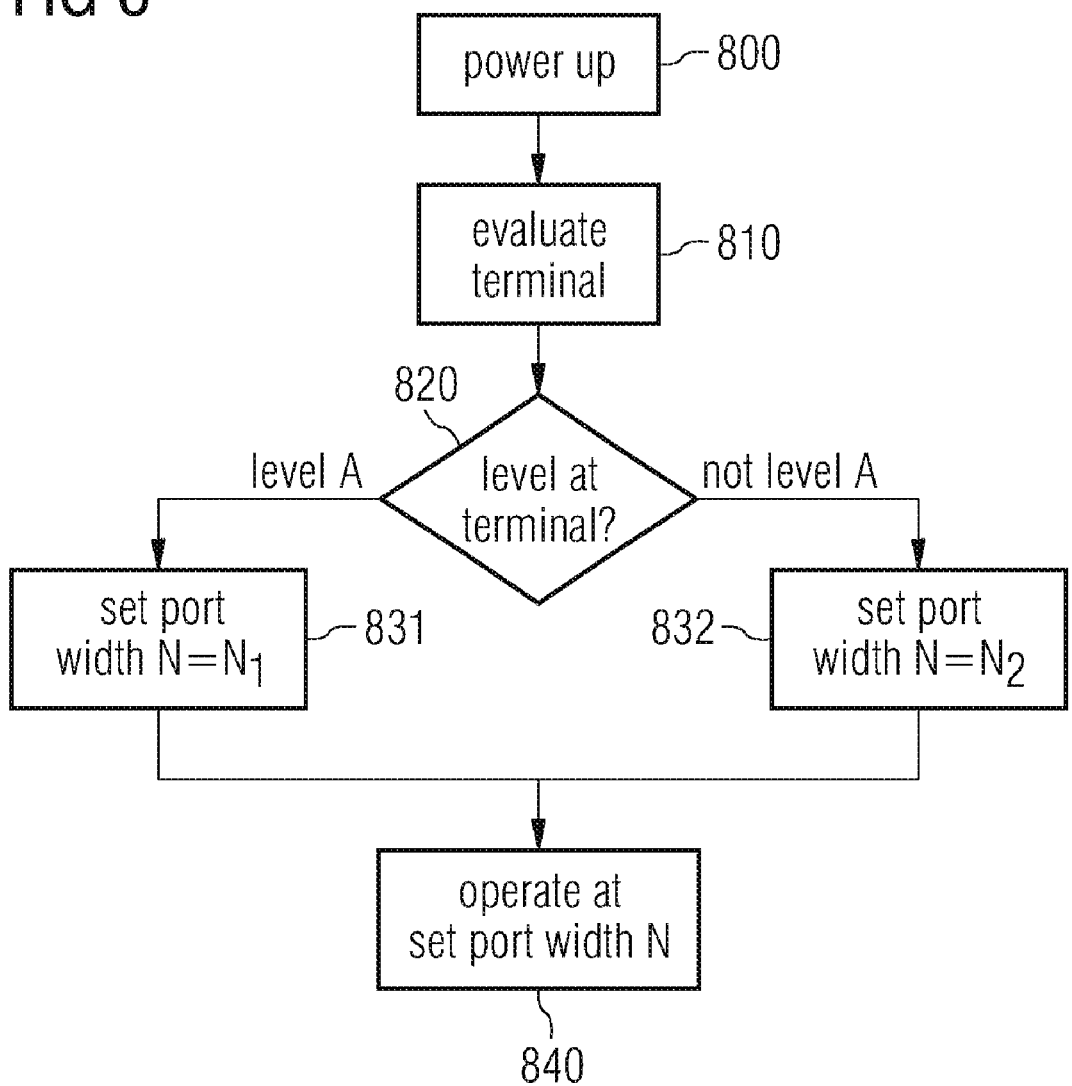

EVALUATION UNIT IN AN INTEGRATED CIRCUIT

BACKGROUND OF THE INVENTION

1. Field of the Invention

The present invention relates to an integrated circuit, a memory device, a memory module, and a computer system. The present invention further relates to a method of operating a memory device.

2. Description of the Related Art

Demands imposed on large scale integrated circuits are constantly increasing. In the case of memory devices, said demands mainly translate into speed and storage capacity. As far as high speed memory devices are concerned, the computer industry has established the so-called DRAM (Dynamic Random Access Memory) as economic means for high-speed and high-capacity data storage.

Although a DRAM requires a continuous refreshing of the stored information, speed and information density, combined with a relatively low cost, have put the DRAM in a pivotal position in the field of information technology. Almost every modern computer system, ranging, for example, from PDAs over notebook computers and personal computers to high-end servers, take advantage of this economic and fast data storage technology.

While the storage capacity of modern memory devices is steadily increased, also the manufacturing costs of a modern memory device may be an important factor for its economic success. At the same time, it may be required to offer memory devices in a range of product variants, in order to ensure economic success. In order to keep manufacturing costs at a minimum, it is a common method to apply options and product variants at a top-most possible level. As far as modern memory devices are concerned, options and variants mostly apply to storage capacity, access speed, and port width. Whereas the former two issues maybe solved on the dye level, the latter issue of providing different port widths may also require different connections schemes at the packaging level. Conventionally, memory devices therefore comprise identical dies which may be connected in different ways, according to the required specifications, during packaging. This so-called bond option determines the actual port width of a memory device at the latest possible moment and, therefore, allows for the use of identical dies for more than one type of the ready product, hence substantially reducing manufacturing costs.

Since conventional manufacturing processes may still require different packaging, chip carriers, and/or bonding, manufacturing costs and process complexity may be still too high for an economic provision of modern memory devices with options and product variations. Conventional memory devices may therefore offer the possibility to activate said product options and variants on the basis of identical ready devices. Variants and options may be activated, for example, via writing respective command values into special registers or via the respective application of signals at dedicated input terminals.

SUMMARY OF THE INVENTION

Various embodiments of the present invention may provide particular advantages for an improved integrated circuit, for an improved memory device, for an improved memory module, for an improved computer system, and for an improved method of operating a memory device.

For one embodiment of the present invention an integrated circuit is provided, the integrated circuit comprising a first terminal for exchanging signals; an evaluation unit coupled to the first terminal, the evaluation unit evaluating a signal level applied to the first terminal to determine whether or not the signal level corresponds to a predetermined signal level; and a switching unit coupled to the first terminal and to the evaluation unit, the switching unit admitting signal exchange via the first terminal if the evaluation unit does not determine the predetermined signal level, the switching unit cutting off signal exchange via the first terminal if the evaluation unit determines the predetermined signal level.

For one embodiment of the present invention a computer system is provided, the computer system comprising a first device having a first terminal exchanging signals, and a second device having a second terminal for exchanging signals, wherein the first device evaluates a signal level applied to the first terminal to determine whether or not the signal level corresponds to a predetermined signal level, first device admitting signal exchange via the first terminal to the second terminal of the second device if the first device does not determine the predetermined signal level, the first device cutting off signal exchange via the first terminal if the first device determines the predetermined signal level.

For one embodiment of the present invention a memory device is provided, the memory device comprising a first terminal for exchanging data; a memory unit; an evaluation unit coupled to the first terminal, the evaluation unit evaluating a signal level applied to the first terminal to determine whether or not the signal level corresponds to a predetermined signal level; and a switching unit coupled to the memory unit and to the evaluation unit, the switching unit admitting data exchange of the memory unit via the first terminal if the evaluation unit does not determine the predetermined signal level, the switching unit cutting off data exchange of the memory unit via the first terminal if the evaluation unit determines the predetermined signal level.

For one embodiment of the present invention a memory module is provided, the memory module comprising a memory controller having a first terminal for exchanging data, and a memory device, the memory having a second terminal for exchanging data, an evaluation unit coupled to the second terminal, the evaluation unit evaluating a signal level applied to the third terminal to determine whether or not the signal level corresponds to a predetermined signal level, and a switching unit coupled to the second terminal and to the evaluation unit, the switching unit admitting data exchange via the second terminal to the first terminal of the memory controller if the evaluation unit does not determine the predetermined signal level, the switching unit cutting off data exchange via the second terminal if the evaluation unit determines the predetermined signal level.

For one embodiment of the present invention a method of operating an integrated circuit is provided, the integrated circuit having a first terminal, the method comprising evaluating a signal level applied to the first terminal; upon a detection of a predetermined signal level admitting of signal exchange via the first terminal; and upon a detection of a signal level different from the predetermined signal level cutting off signal exchange via the first terminal.

BRIEF DESCRIPTION OF THE DRAWINGS

These above recited features of the present invention will become clear from the following description, taking in conjunction with the accompanying drawings. It is to be noted, however, that the accompanying drawings illustrate only typical embodiments of the present invention and are, therefore, not to be considered limiting of the scope of the invention. The present invention may admit equally effective embodiments.

FIG. 7 shows a schematic view of a connection scheme of a memory device according to an eleventh embodiment of the present invention; and FIG. 8 shows a schematic flow-chart of a method of controlling a memory device according to a twelfth embodiment of the present invention.

DETAILED DESCRIPTION OF THE PREFERRED EMBODIMENT

Figure 1A:
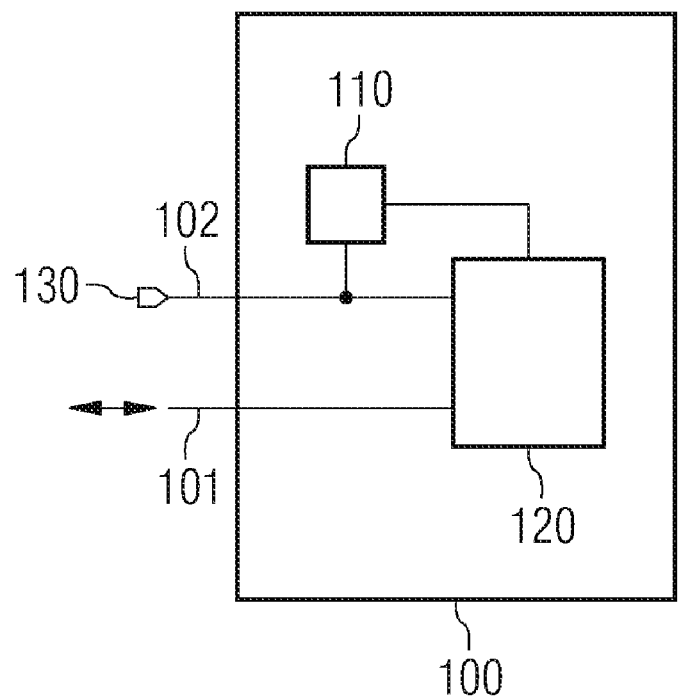
FIGS. 1A and 1B show a schematic view of an integrated circuit according to a first and a second embodiment of the present invention.

FIG. 1A shows a schematic view of an integrated circuit 100 according to a first embodiment of the present invention. The integrated circuit 100 comprises an evaluation unit 110 and a switching unit 120. The integrated circuit 100 further comprises a first terminal 101 and a second terminal 102.

The integrated circuit 100 exchanges signals via the first terminal 101 and the second terminal 102. The terminals 101, 102 may comprise a single signal line or a port with more than one signal line for receiving and/or transmitting signals. According to this embodiment of the present invention, the second terminal 102 of the integrated circuit 100 is coupled to a signal source, for example a voltage source 130 as shown in FIG. 1A. For example, upon initialization or power up, the evaluation unit 110 determines a voltage level being applied to the second terminal 102 by the voltage source 130. In case the determined voltage corresponds to a control voltage, the evaluation unit 110 instructs the switching unit 120 such that all signals are exchanged only by the first terminal 101 of the integrated circuit 100. Since all signals are then henceforth exchanged by the first terminal 101, the second terminal 102 may not be used anymore, and, may also be coupled to the voltage source 130 via a fixed connection.

Figure 1B:
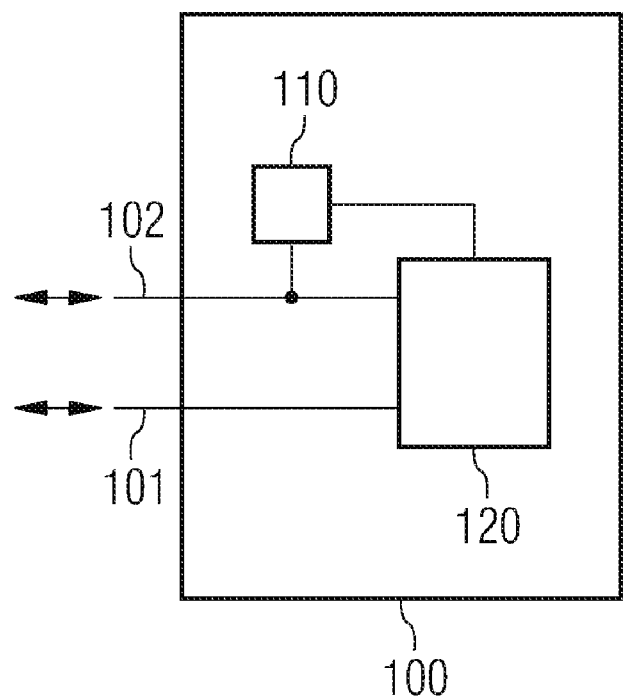

FIG. 1B shows a schematic view of the integrated circuit 100 according to a second embodiment of the present invention. According to this embodiment, the integrated circuit 100, comprising the evaluation unit 110, the switching unit 120, the first terminal 101, and the second terminal 102, is supposed to exchange signals via both terminals 101, 102. In this case, the second terminal 102 may be coupled to other entities of a superordinate circuitry. However, it may be connected such that the evaluation unit 110 does not determine a voltage at the second terminal 102 that corresponds to said control voltage, as described in conjunction with FIG. 1A in which the second terminal 102 is coupled to the control voltage source 130. According to this embodiment, the evaluation unit 110 instructs the switching unit 120 such that both terminals 101, 102 are used for signal exchange.

Figure 2A:
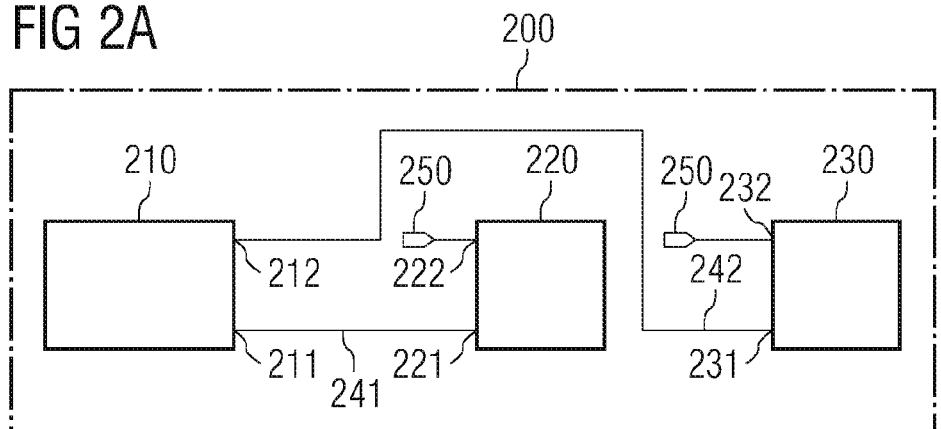
FIGS. 2A and 2B show a schematic view of a computer system according to a third and fourth embodiment of the present invention.

FIG. 2A shows a schematic view of a first computer system 200 according to a third embodiment of the present invention. The computer system 200 comprises a first device 210, a second device 220, and a third device 230. A first terminal 211 of the first device 210 is coupled to a first terminal 221 of the second device 220 via a first signal line 241. A second terminal 212 of the first device 210 is coupled to a first terminal 231 of the third device 230 via a second signal line 242. A second terminal 222 of the second device 220 and a second terminal 232 of the third device 230 are coupled to a voltage source 250.

According to this embodiment of the present invention, the first device 210 may exchange signals with the second device 220 and the third device 230 via the signal lines 241, 242. The devices 220, 230, being, for example, integrated circuits 100 as described in conjunction with FIG. 1A, only employ their first terminal 221, 231 respectively for signal exchange. The application of a control voltage at the second terminals 222, 232 by means of the voltage terminals 250 instructs the devices 220, 230 such that they exchange signals only via their first terminals 221, 231 respectively. Since the devices 220, 230 are instructed to use only their first terminals 221, 231 the second terminals 222, 232 may be employed to apply the control voltage. According to this embodiment of the present invention, the application of the control voltage may be carried out at these second terminals 222, 232, since the application of the voltage instructs the devices not to use these second terminals 222, 232 for other purposes.

Figure 2B:
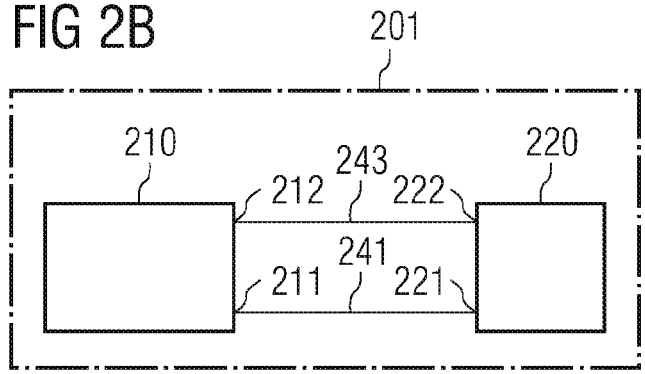

FIG. 2B shows a schematic view of a second computer system 201 according to a fourth embodiment of the present invention. The second computer system 201 comprises the first device 210 and at least the second device 220. The first terminal 211 of the first device 210 is coupled to the first terminal 221 of the second device 220 via the first signal line 241. The second terminal 212 of the first device 210 is coupled to the second terminal 222 of the second device 220 via a third signal line 243. According to this embodiment of the present invention and in deviation from the embodiment as described in conjunction with the preceding FIG. 2A, the second terminal 222 of the second device 220 is coupled to the second terminal 212 of the first device 210. According to this embodiment, an application of a control voltage which would instruct the second device 220 such that it uses only its first terminal 221 for signal exchange does not take place. Rather the second terminal 222 is coupled to the first device 210. This instructs the second device 220 such that it uses both terminals 221, 222 for signal exchange. Comparing the third and fourth embodiments of the present invention, as described in FIGS. 2A and 2B respectively, it becomes clear that an identical device, such as the second device 220, may be used and applied in more than one setup as the computer systems 200, 201, using a different number of signal lines in each application. Selection of the type of circuitry the device 220 is applied to, may be carried out solely by the application of a signal level, for example a control voltage at a terminal, such as the second terminal 222, signalling that this terminal is not used for other purposes. The functionality of this terminal may be transferred to another terminal, such as the first terminal 221.

Figure 3:
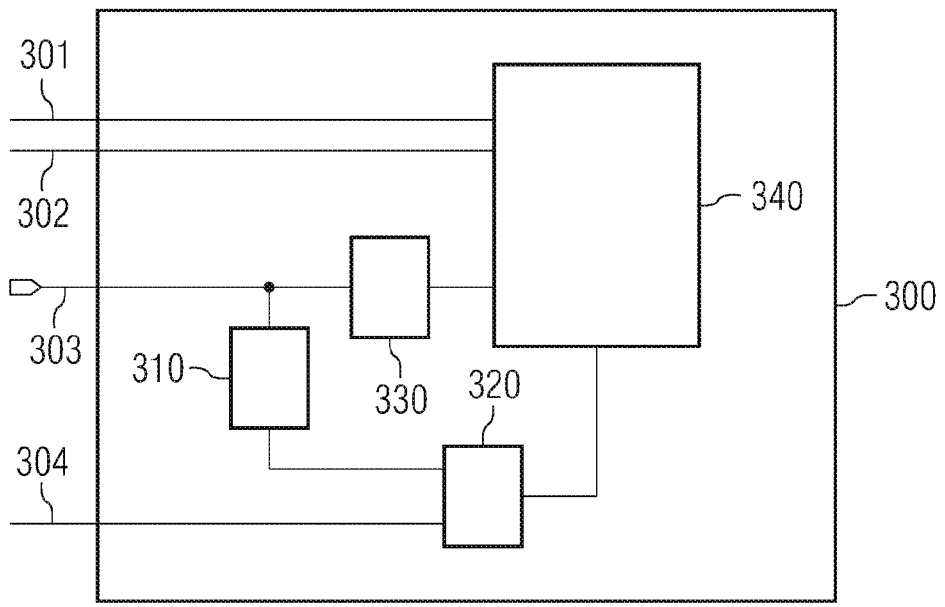
FIG. 3 shows a schematic view of a memory device according to a fifth embodiment of the present invention.

FIG. 3 shows a schematic view of a memory device 300 according to a fifth embodiment of the present invention. A memory device 300 comprises an evaluation unit 310, a switching unit 320, a driver unit 330 and a memory unit 340. The memory unit 340 may exchange data via a first port 301 and a second port 302. The first port 301 and the second port 302 may comprise one or more signal lines for a parallel data exchange. Such ports may include one, two, four, eight, sixteen, thirty-two or sixty-four lines or bits per port.

A first terminal 303 is coupled to the driver unit 330 and to the memory unit 340. The first terminal 303 may be used in conjunction with the second port 302 or may be part of the second port 302. The evaluation unit 310 determines the voltage applied to the first terminal 303. The switching unit 320 may evaluate the output of the evaluation unit 310 in conjunction with a signal from a second terminal 304. The switching unit 320 may instruct the memory unit 340 to use both ports 301, 302 or only one port, such as the first port 301 for data exchange. It is to be noted, however, that the memory unit 340 may exchange data by more than two ports, and the evaluation unit 310 and the switching unit 320 may instruct the memory unit 340 such that it uses all of those ports or only a fraction of those ports, depending on a voltage being applied to the first terminal 303.

According to this embodiment of the present invention, the first terminal 303 is coupled to a voltage which corresponds to a control voltage. This control voltage is identified such that the evaluation unit 310 determines that the memory unit 340 is to exchange data via only one port, for example, the first port 301. The switching unit 320 may evaluate the result from the evaluation unit 310 in conjunction with a signal at the second terminal 304. For example, a reset signal may be transmitted via the second terminal 304. Hence, the switching unit 320 may instruct the memory unit 340 accordingly only upon the reset condition, even if the control voltage is applied to the first terminal 303 outside the reset condition. Therefore, it is possible to couple a control voltage to the first terminal 303 in a fixed way, which, in turn, may render an additional driver, timer, delay line, and/or a logic gate obsolete.

Figure 4A:
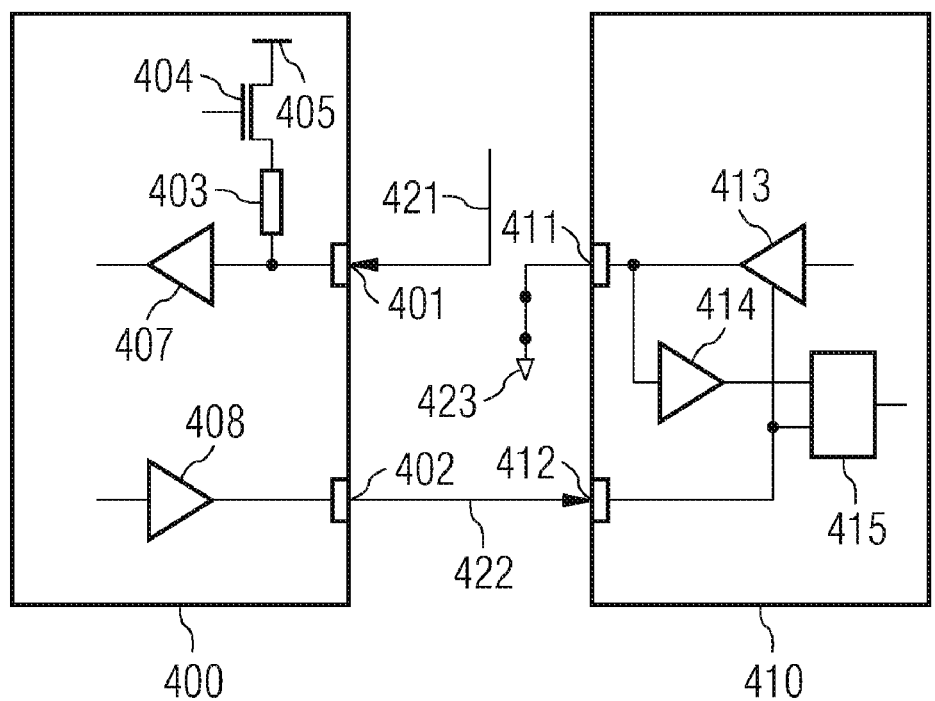
FIGS. 4A and 4B show a schematic view of a memory controller and a memory device according to a sixth and seventh embodiment of the present invention.

FIG. 4A shows a schematic view of a memory controller 400 and a memory device 410 according to a sixth embodiment of the present invention. The memory controller comprises a first terminal 401, a second terminal 402, a termination resistor 403, a termination switch 404, a termination voltage terminal 405, a receiving unit 407, and a transmitting unit 408. The first terminal 401 is coupled to the receiving unit 407 and to the termination voltage terminal 405 via the termination switch 404 and the termination resistor 403. The second terminal 402 is coupled to the transmitting unit 408. The memory device 410 comprises a first terminal 411, a second terminal 412, a transmitting unit 413, an evaluation unit 414, and a switching unit 415.

The first terminal 401 may be internally terminated to the termination potential at the termination voltage terminal 405, which, for example, may be tied to ground, to a supply voltage, or to a voltage between the ground potential and the supply voltage. A typical ground potential lies at 0 volts, whereas typical supply voltages range from 1 volt to 15 volts. The switch 404 enables the memory controller 400 to switch on and off the termination of the first terminal 401. It shall be noted however, that termination of a terminal may equally be effected by means of an external termination resistor which is tied to a desired termination potential.

The evaluation unit 414 of the memory device 410 is coupled to the first terminal 411 and may detect a voltage being applied to the first terminal 411. A control signal which may be transmitted by the transmitting unit 408 of the memory controller 400 and received by the second terminal 412, such as a reset signal, is also coupled to a switching unit 415. This signal may also act as an enable signal for the transmitting unit 413.

According to this embodiment of the present invention, the first terminal 411 of the memory device 410 is coupled to a control voltage. The second terminal 412 of the memory device is coupled to the second terminal 402 of the memory controller 400 via a second signal line 422. Tying the first terminal 411 to this control voltage may instruct the memory device to use only a specific number of ports for data exchange, instead of using all or more of its ports. Specifically, the first terminal 411 may be amongst those ports and terminals instructed to remain unused, and, hence, may be tied to the control voltage via a fixed connection. The control voltage may therefore be applied to the terminal 411 during the entire operation, since the application of the control voltage signals that it shall not be used for other purposes during operation.

The switching unit 415 may be a D-type flip flop, the D-port of which coupled to the evaluation unit 414, and the clock port coupled to the second terminal 412. The Q or inverted Q output of the flip flop may be set according to the state on the input upon a low to high transition or a high to low transition at the clock terminal. Upon a reset condition the transmitting unit 408 may drive the signal on the second signal line, for example, from a low level to a high level. The voltage being applied at the first terminal 411 is evaluated by the evaluation unit 414 and this output is sampled by the switching unit 415 at the level transition, and, for the D-type flip flop, remains constant until the next low to high transition occurs at the clock input. According to this embodiment, the output of the switching unit 415 may instruct other entities of the memory device 410 such that it does not use the first terminal 411 and/or other ports for data exchange. This may also imply that signals, usually exchanged by these disabled ports and terminals, become rerouted to ports and terminals still in use in this mode.

The first terminal 401 of the memory controller 400 is coupled to a first signal line 421. In case that the termination switch 404 is rendered conductive and the voltage of the termination voltage terminal 405 differs from the control voltage at the control voltage terminal 423, this first terminal 401 of the memory controller 400 may be coupled to a second terminal of a next memory device which then instructs this memory device such that it uses this terminal. The first signal line 421 may also be coupled to a next terminal of the memory device 410, such to instruct the memory device 410 to use this next terminal and/or other ports for signal exchange.

The first terminal 411 may be an error detection code terminal (EDC) of the memory device 410. Usually, only one EDC terminal is employed per port on a memory device, which may suffice for instructing the memory device 410 as desired. Other terminals of a port, such as a clock terminal, a command terminal, or a data terminal may be used for the application of the signal as well, the signal being, for example, the control voltage from the voltage source 423. The coupling of the evaluation unit 414 to the first terminal 411 may further alter the terminal impedance as compared to a terminal which is only coupled to the transmitting unit 413. Coupling the evaluation unit 414 to one terminal of a group of terminals, such as to one data line of a multi-bit port, may require impedance compensation for the remaining lines of the port. In this case it may be desired that all terminals of the group provide corresponding impedances. Above all, this applies to a high-speed port for parallel data exchange, for example, a parallel 8-bit port for exchanging one byte.

Figure 4B:
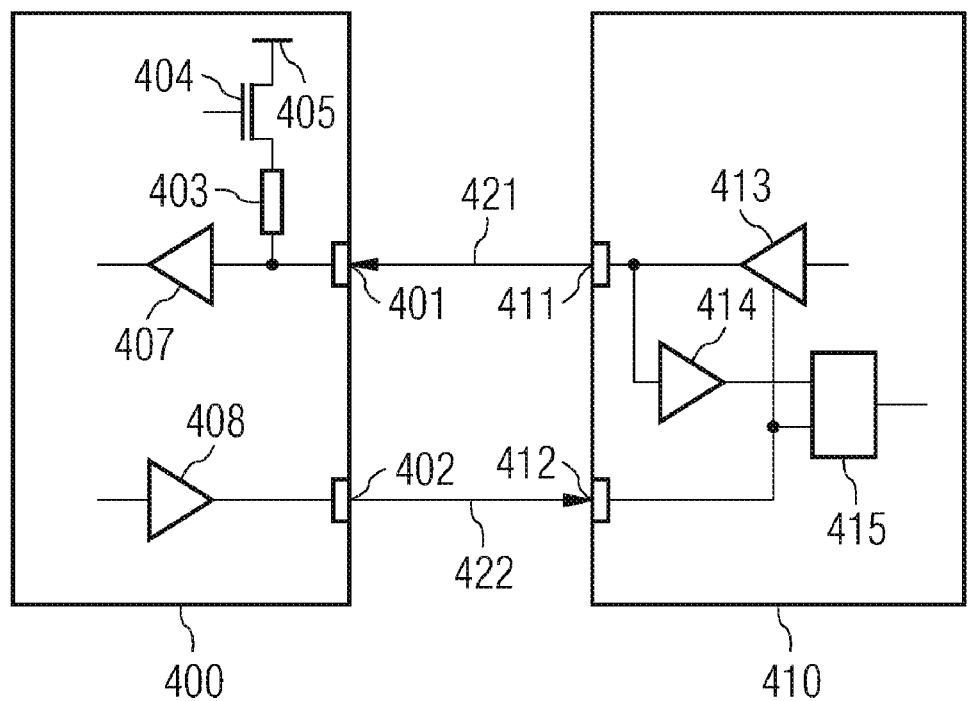

FIG. 4B shows a schematic view of the memory controller 400 and the memory device 410 according to a seventh embodiment of the present invention. The memory controller 400 and the memory device 410 were already described in conjunction with FIG. 4A. However, the arrangement according to this embodiment is such that the first signal line 421 couples the first terminal 401 of the memory controller 400 to the first terminal 410 of the memory device 410. The termination switch 404 may be rendered conductive and hence may couple a termination potential from the termination voltage terminal 405 via the termination resistor 403 to the first terminal 401. The voltage at the termination voltage terminal 405 may differ from the control voltage.

Tying the first terminal 411 to a voltage different from the control voltage may instruct the memory device 410 to use a different specific number of ports for data exchange, as compared to the arrangement of FIG. 4A. Furthermore, the memory device 410 may use, instead of using only a fraction of its ports and terminals for signal and/or data exchange, all of its ports and/or terminals.

The second evaluation unit 415 may be a D-type flip flop, the D-port of which coupled to the first evaluation unit 414, and the clock port coupled to the second terminal 412. The Q or inverted Q output of the flip flop may be set according to the state on the input upon a low to high transition or a high to low transition at the clock terminal. Upon a reset condition the transmitting unit 408 may drive the signal on the second signal line, for example, from a low level to a high level. The voltage being applied at the first terminal 411 is evaluated by the first evaluation unit 414 and this output is sampled by the second evaluation unit 415 at the level transition, and, for the D-type flip flop, remains now constant until the next low to high transition occurs at the clock input. Since this output may now be different from the output of the situation as described in FIG. 4A, the output of the second evaluation unit 415 may instruct other entities of the memory device 410 such that it uses the first terminal 411 and/or other ports for data exchange. This option may include the situation in which all ports and/or terminals of the memory device 410 are used for data and/or signal exchange.

Figure 5A:
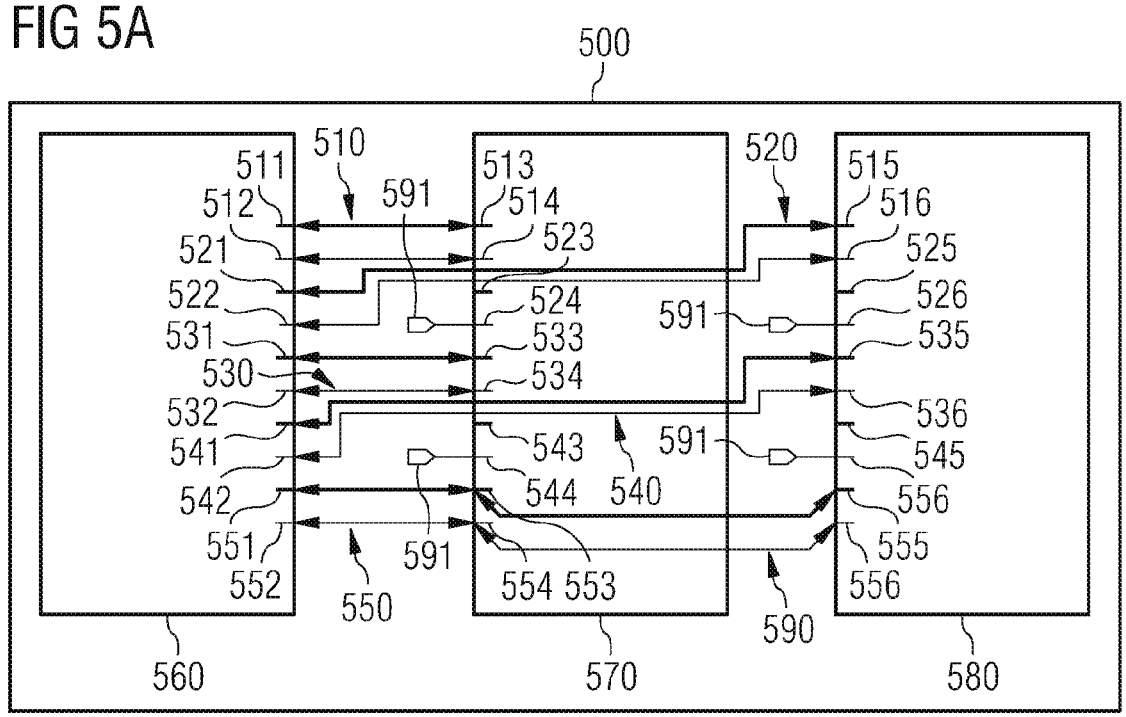
FIGS. 5A and 5B show a schematic view of a memory module according to an eight and ninth embodiment of the present invention.

FIG. 5A shows a schematic view of a first memory module 500 according to an eight embodiment of the present invention. The memory module 500 comprises a memory controller 560, a first memory device 570 and a second memory device 580. The memory controller 560 comprises a first terminal 511, a second terminal 512, a third terminal 521, a fourth terminal 522, a fifth terminal 531, a sixth terminal 532, a seventh terminal 541, an eight terminal 542, a ninth terminal 551, and a tenth terminal 552. The terminals 511 through 552 of the memory controller 560 may comprise one or more signal lines. The terminals 511, 521, 531, 541, 551 usually comprise one or more signal terminals for exchanging data, such as data being stored in one of the memory devices or such as address data. The terminals 512, 522, 532, 542, 552 usually comprise one or more signal terminals for control signals, such as a reset signal or an error detection code signal (EDC).

The first memory device 570 is coupled to the memory controller 560 via a first bus 510, a third bus 530, and a fifth bus 550. The first memory device 570 comprises a first terminal 513, a second terminal 514, a third terminal 523, a fourth terminal 524, a fifth terminal 533, a sixth terminal 534, a seventh terminal 543, an eight terminal 544, a ninth terminal 553, and a tenth terminal 554. The first bus 510 couples the first terminal 511 of the memory controller 560 to the first terminal 513 of the first memory device 570 and the second terminal 512 of the memory controller 560 to the second terminal 514 of the first memory device 570. Likewise, the third bus 530 couples the terminal 531 to the terminal 533 and the terminal 532 to the terminal 534, and the fifth bus 550 couples the terminal 551 to the terminal 553 and the terminal 552 to the terminal 554.

The second memory device 580 is coupled to the memory controller 560 via a second bus 520 and a fourth bus 540. The second memory device 580 comprises a first terminal 515, a second terminal 516, a third terminal 525, a fourth terminal 526, a fifth terminal 535, a sixth terminal 536, a seventh terminal 545, an eight terminal 546, a ninth terminal 555, and a tenth terminal 556. The second bus 520 couples the third terminal 521 of the memory controller 560 to the first terminal 515 of the second memory device 580 and the fourth terminal 522 of the memory controller 560 to the second terminal 516 of the second memory device 580. Likewise, the fourth bus 540 couples the terminal 541 to the terminal 535 and the terminal 542 to the terminal 536. A sixth bus 590 couples the ninth terminal 553 and the tenth terminal 554 of the first memory device 570 to the ninth terminal 555 and the tenth terminal 556 of the second memory device 580. The second memory device 580 is hence coupled to the memory controller 560 in that the terminal 551 is coupled to the terminal 553, the terminal 553 is coupled to the terminal 555, the terminal 552 is coupled to the terminal 554, and the terminal 554 is coupled to the terminal 556. The fifth bus 550 is prolonged to the second memory device 580 via the sixth bus 590 and in this way data and signals, such as address data, may be coupled to more than one memory device, such as the memory devices 570, 580 as shown here.

According to this embodiment of the present invention, the fourth terminal 524 and the eight terminal 544 of the first memory device 570 are coupled to a voltage terminal 591. Likewise, the fourth terminal 526 and the eight terminal 556 of the second memory device 580 are coupled to a voltage terminal 591. The voltage terminals 591 provide a predetermined control voltage level such to instruct the first memory device 570 and the second memory device 580 to use only a fraction of the terminals for signal exchange. In the example, as shown here, the first memory device 570 may only use the first terminal 513, the second terminal 514, the fifth terminal 533, and the sixth terminal 534 for storage data exchange. The third terminal 523, and the seventh terminal 543 of the first memory device 570 may not be used and may further remain unconnected. The same applies to the second memory device 580, as the fourth terminal 526 and the eight terminal 556 of the second memory device 580 are coupled to the control voltage by the voltage terminals 591 such to instruct the second memory device 580 to use only the first terminal 515, the second terminal 516, the fifth terminal 535, and the sixth terminal 536 for storage data exchange. The fourth terminal 525 and the seventh terminal 545 may not be used and may further remain unconnected.

According to this embodiment, the same target address may be applied simultaneously to the first memory device 570 and the second memory device 580 via the busses 550, 590. The first memory device 570 may provide byte 0 and byte 2 via the first bus 510 and the third bus 530, whereas byte 1 and byte 3 are provided by the second memory device 580 via the second bus 520 and the fourth bus 540. By using only two of their ports for data exchange, the first memory device 570 and the second memory device 580 each provide only a half of a four byte word being read or written by the memory controller 560. The memory devices 570, 580 may provide, for example, two bytes with 8 bits equaling a port width of 16 bits, which may be denoted as x16. Further arrangements may include x1, x2, x4, x8, x16, x32, and x64, wherein, for example, at x1, 32 memory devices each provide one bit of an overall bus with a width of 32 bits, and, for example, at x32 a single memory device may provide all bits of the bus with the width of 32 bits. The control signals being exchanged between the memory controller 560 and the memory devices 570, 580 may also include clock signals, reset signals and/or error detection code signals.

Figure 5B:
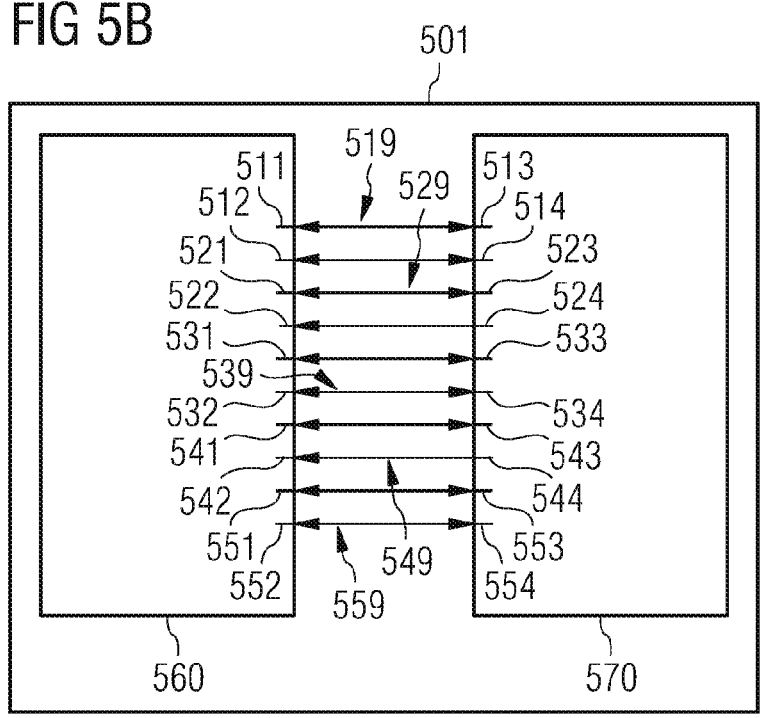

FIG. 5B shows a schematic view of a second memory module 501, according to a ninth embodiment of the present invention. The second memory module 501 comprises the memory controller 560 and at least the first memory device 570. According to this embodiment, the first terminal 511 through the tenth terminal 552 of the memory controller 560 are coupled to the first terminal 513 through the tenth terminal 554 of the first memory device 570. Since the terminals 524, 554 of the first memory device 570 are not coupled to a control voltage, for example by means of the control voltage terminals 591 as described in conjunction with FIG. 5A, but instead to the terminals 522, 542 of the memory controller 560, the first memory device 570 is instructed such that it uses all terminals for signal exchange.

Although the memory device 570 being employed in this embodiment may be the same as the memory devices 570, 580 of FIG. 5A, different configurations and arrangements may be realized. Since the memory device 570 may change its effective bus width upon a detection of a signal level, according to this embodiment the control voltage at, for example, the terminal 524, 544, the memory device 570 may be arranged in different memory modules. In this way, the addition of memory devices may increase the data storage capacity of a memory module while still allowing for a point to point connection between the terminals of a memory controller and a memory device. According to this embodiment, the memory controller 560 may ensure that the voltage being applied to the terminals 524, 544 is such that the memory device 570 uses all its ports for data exchange, i.e. that the applied voltage differs from the control voltage as being applied by the voltage terminal 591 in the embodiment described in conjunction with FIG. 5A.

Figure 6:
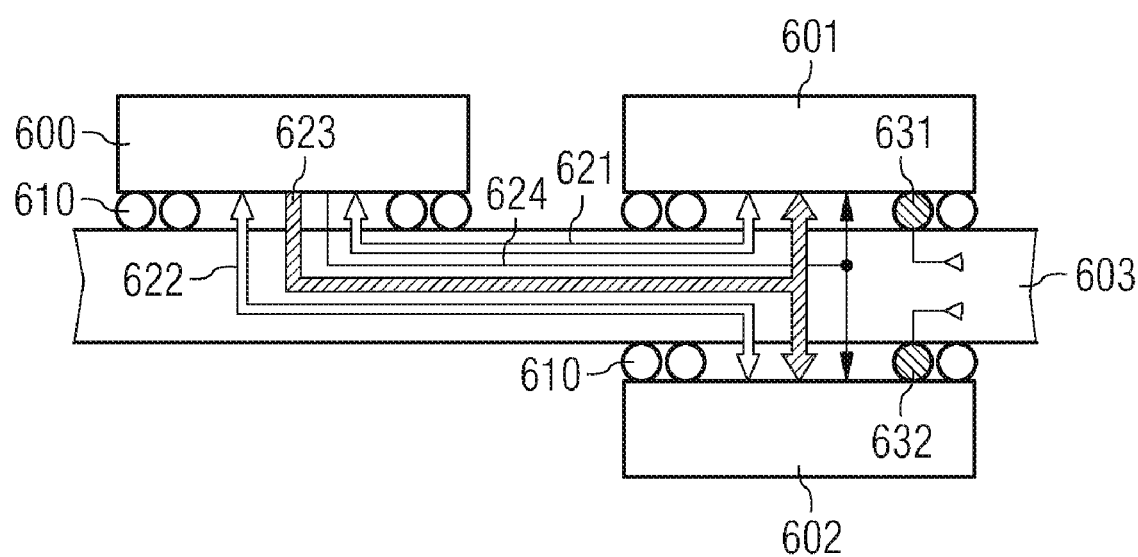
FIG. 6 shows a schematic view of a memory module according to tenth embodiment of the present invention.

FIG. 6 shows a schematic view of a memory module according to a tenth embodiment of the present invention. The memory module may be a memory module such as a graphic board or a DIMM. The memory module comprises a memory controller 600, a first memory device 601, and a second memory device 602. The memory module may be realized on a printed circuit board (PCB) 603, which comprises a first data bus 621, a second data bus 622 and an address transmission bus 623. The data buses 621, 622 and the address transmission bus 623 may comprise one or more signal lines and may be realized as conductive traces in one or more layers in the printed circuit board 603. Traces may end with terminals such as landing pads at connection points for the respective connection to the memory devices 601, 602, or the memory controller 600.

The layout of the connection terminals of the two memory devices 601, 602 may correspond to the layout 700 as shown in FIG. 7. Modern memory modules take advantage of a symmetrical and appropriate terminal layout of the connection terminals. This allows for a simple and reliable connection of more than one memory device to a memory controller. According to this embodiment two memory devices 601, 602 are mounted on both sides of the PCB 603. The layout of the connection terminals may allow for the arrangement that the same values may be put on the address transmission bus 623, then each of the memory devices 601, 602 providing one part of the data via the first data bus 621 and the second data bus 622. A clock signal may be provided to the memory devices 601, 602 by the memory controller 600 via clock signal line 624.

According to this embodiment of the present invention, a terminal 631 of the first memory device 601 and a terminal 632 of the second memory device 602 are coupled to a control voltage, which may correspond to a ground potential, to a supply potential, or to a potential between the ground and the supply potential. Said potentials may be easily accessible on the printed circuit board 603. Application of the control voltage to the terminals 631, 632 may instruct the memory devices 601, 602 such that they use only a fraction of their ports and/or terminals. Furthermore the effective bus width may be set accordingly, and the memory devices may each provide only a fraction of port width to the controller 600. In this way, storage capacity may be increased by adding memory devices, while still allowing for a point-to-point connection between the memory controller 600 and memory devices, such as the memory devices 601, 602. The memory devices 601, 602 may be used in a variety of arrangements, providing different port widths per memory device and different values of the module memory capacitance, since they may be configured for those arrangements via the application of a control voltage to terminals. Said terminals may not be used then for other purposes in the specific application, and may, hence, be coupled to a control voltage via a fixed connection.

FIG. 7 shows a schematic view of a terminal layout 700 of a memory device according to an eleventh embodiment of the invention. The layout comprises a first group of terminals 701, a second group of terminals 702, a third group of terminals 703, and a fourth group of terminals 704. Said groups of terminals may comprise terminals of a bus, a port, or signal lines. According to this embodiment, the arrangement of terminals is such that equivalent terminals face each other when two memory device are mounted on one printed circuit board, each device on one side of the board. Applying a control voltage to one terminal, for example to an error detection code (EDC) terminal 721, may instruct the memory device such that it uses only a fraction of its ports and/or terminals. For example, the application of a control voltage to terminal 721 may instruct the memory device not to use the terminals of the second group 702 and the fourth group 704. Rather, the memory device may provide only a byte 0 and a byte 2 of a four-byte word via the first and third terminal groups 701, 703, whilst still providing its full storage capacitance. A second memory device, being mounted on the facing side of a printed circuit board and being rotated by 180° around an axis 710, may then provide byte 1 and byte 3 of the four-byte word.

In this way, storage capacity may be increased by adding memory devices, while still allowing for a point-to-point connection between a memory controller and several memory devices. The same type of memory device may then be used in a variety of arrangements, providing different port widths per memory device and different values of the overall memory capacitance of the memory system. The terminals which are coupled to a signal source, according to this embodiment a control voltage, such as the terminal 721, may not be used then for other purposes in the specific application, and may, hence, be coupled to a control voltage via a fixed connection. Furthermore, this deactivation may apply to other terminals as well, such as the remaining terminals of the second group 702.

FIG. 8 shows a sequential view of a method according to a twelfth embodiment of the present invention. According to this embodiment, a power up stage 800 is provided for the operation a memory device. After the powering up stage 800, the memory device may evaluate a terminal during an evaluation stage 810. At least a level, such as level A, may be determined and distinguished from other levels during the evaluation stage 810 and may lead to two different decisions at a bifurcation 820. Upon a detection of level A, a port width N is set to $N_1$ during a first alternative 831. Upon a detection of another level instead of level A, the port width N is set to $N_2$ during a second alternative 832. The memory device then operates at the set port width N during the regular operation 840.

The preceding description describes advantageous exemplary embodiments of the invention. The features disclosed therein and the claims and the drawings can, therefore, be useful for realizing the invention in its various embodiments, both individually and in any combination. While the forgoing is directed to embodiments of the present invention, other and further embodiments of this invention may be devised without departing from the basic scope of the invention, the scope of the present invention being determined by the claims that follow.

What is claimed is:

1. A memory module, comprising:
    a memory controller having a first terminal for exchanging data; and
    a memory device, the memory having:
        a second terminal for exchanging data;
        an evaluation unit coupled to the second terminal, the evaluation unit evaluating a signal level applied to the second terminal to determine whether the applied signal level corresponds to a predetermined signal level; and
        a switching unit coupled to the second terminal and to the evaluation unit, the switching unit being configured to admit data exchange via the second terminal to the first terminal of the memory controller when the evaluation unit determines that the applied signal level does not correspond to the predetermined signal level, the switching unit being further configured to cut off data exchange via the second terminal if the evaluation unit determines that the applied signal level corresponds to the predetermined signal level.

2. The memory module as claimed in claim 1, wherein the second terminal of the memory device is coupled to a signal source via a fixed connection when the predetermined signal level is applied to the second terminal.

3. The memory module as claimed in claim 2, wherein the second terminal of the memory device is coupled to a voltage source.

4. The memory module as claimed in claim 1,
    wherein the memory controller comprises a transmitting unit coupled to a third terminal;
    wherein the memory device comprises a fourth terminal coupled to the third terminal of the memory controller and to the switching unit of the memory device; and
    wherein the switching unit of the memory device is configured to sample the signal level determination of the evaluation unit in conjunction of a data signal applied by the transmitting unit of the memory controller via the third terminal and the fourth terminal.

5. The memory module as claimed in claim 4,
    wherein the switching unit of the memory device is a flip-flop.

6. The memory module as claimed in claim 1,
    wherein the memory controller further comprises a termination resistor, a termination switch, a termination voltage terminal, a receiving unit and a transmitting unit;
    wherein the first terminal of the memory controller is coupled to the receiving unit and to the termination voltage terminal via the termination switch and the termination resistor; and
    wherein the first terminal of the memory controller is coupled to the second terminal of the memory device via at least a signal line when the predetermined signal level is not applied to the second terminal of the memory device.

7. The memory module as claimed in claim 1,
    wherein the second terminal of the memory device comprises at least two data ports;
    wherein the evaluation unit of the memory device is configured to evaluate the signal level applied to at least one data port of the at least two data ports of the second terminal to determine whether the applied signal level corresponds to the predetermined signal level; and
    wherein the switching unit of the memory device is configured to admit data exchange via the at least two data ports of second terminal when the evaluation unit of the memory device determines that the applied signal level does not correspond to the predetermined signal level and cut off data exchange via the at least two data ports of the first terminal when the evaluation unit of the memory device determines that the applied signal level corresponds to the predetermined signal level.

* * * * *